United States Patent
Ross et al.

(10) Patent No.: US 6,214,152 B1
(45) Date of Patent: Apr. 10, 2001

(54) LEAD FRAME MOISTURE BARRIER FOR MOLDED PLASTIC ELECTRONIC PACKAGES

(75) Inventors: Richard J. Ross; Cynthia L. Ross, both of Moraga; Tony B. Shaffer, Alameda; John Qiang Ni, Oakland, all of CA (US)

(73) Assignee: RJR Polymers, Inc., Oakland, CA (US)

( * ) Notice: Subject to any disclaimer, the term of this patent is extended or adjusted under 35 U.S.C. 154(b) by 0 days.

(21) Appl. No.: 09/273,608

(22) Filed: Mar. 22, 1999

(51) Int. Cl.[7] ..................................................... B29C 45/00
(52) U.S. Cl. ............... 156/245; 264/272.11; 264/272.13; 264/272.17
(58) Field of Search .......................... 264/272.11, 272.13, 264/272.17; 257/753; 29/841, 855, 856; 438/106, 111, 112, 118, 124, 127; 156/145, 196, 244.12, 290, 291, 242, 245

(56) References Cited

U.S. PATENT DOCUMENTS

| | | | |
|---|---|---|---|
| 5,122,858 | * | 6/1992 | Mahulikar et al. . |
| 5,205,036 | * | 4/1993 | Yamazaki . |
| 5,458,716 | * | 10/1995 | Alfaro et al. ........................ 156/245 |
| 5,817,544 | * | 10/1998 | Parthasarathi . |
| 6,048,754 | * | 4/2000 | Katayama et al. ................... 438/115 |

* cited by examiner

Primary Examiner—Michael W. Ball
Assistant Examiner—John T. Haran
(74) Attorney, Agent, or Firm—Townsend and Townsend and Crew LLP

(57) ABSTRACT

Electronic packages that consist of dies sealed within hollow plastic enclosures with electrically conductive leads penetrating the enclosure walls to access the die circuitry are manufactured by applying a heat-curable adhesive to the leads at only those locations where the surfaces of the leads will interface with the enclosure material, molding the package around the leads, and curing the adhesive during the molding process or during a post-cure. The adhesive is formulated to form a gas-tight seal around the leads and to maintain the seal during the thermal cycling that the components are exposed to during the typical procedures involved in manufacturing the packages and in making the electrical connections to other circuitry, as well as the typical environmental changes that the finished and installed product is exposed to during use. In particular, the adhesive is selected to accommodate differences in the coefficients of thermal expansion between the leads and the enclosure material while still maintaining a vapor-tight seal.

16 Claims, No Drawings

LEAD FRAME MOISTURE BARRIER FOR MOLDED PLASTIC ELECTRONIC PACKAGES

This invention resides in the field of electronic packaging. The invention involves the placement of an integrated circuit die in a hollow enclosure that protects the chip from the environment and provides electrical access to the die circuitry from leads outside the enclosure. The invention is specifically concerned with the enclosure as a barrier against penetration by moisture and contaminating gases in general.

BACKGROUND OF THE INVENTION

An electronic package serves as a protective enclosure for a die while permitting electrical connections between the die circuitry and the circuitry on a carrier or substrate such as a printed wiring board. The packages of interest in this invention are hollow bodies that filly enclose the die and that are initially formed as open receptacles with electrical leads or "traces" embedded in the walls. Once the receptacle is formed with the leads embedded in its walls, the die is placed inside the receptacle and electrically joined to the leads. The receptacle is then closed and sealed for further processing, including further electrical connections and use.

To achieve consistent and reliable performance with the extremely fine circuit lines and high current densities that are currently used in dies, it is very important that water vapor and other atmospheric gases be prevented from entering the package once it is sealed. By sealing the die and protecting it from exposure to these gases, the package enhances the performance of the die in humid and other potentially harmful environments. The leads that form the electrical connections between the die and the components external to the package are thin strips of metal that pass through the package walls, the inner ends of the strips bonded to the die circuitry and the outer ends available for bonding to the substrate circuitry. Since the strips and the package walls are made of dissimilar materials, it is difficult to form a secure bond between them that will serve as a vapor barrier. This difficulty is particularly acute when there are large differences in the rates of expansion and contraction of the materials. This expansion and contraction occurs in response to temperature variations that occur during the thermal cycling that the package encounters during processing steps such as die bonding, wire bonding and soldering. Temperature variations also occur in the typical environment in which the package used also stem from the high current densities used in the die itself. As a result, the points where the leads penetrate the walls are particularly vulnerable to the formation of gaps through which gases can enter the package and contaminate the die.

The typical method of sealing the interfaces between the metal leads and the package walls is to form the package by molding the walls directly over the leads. Injection molding or transfer molding are typically used, starting with a molten heat-curable resin which is cured either during the molding process or shortly afterwards in a post-cure. These molding techniques form a mechanical bond between the metal and plastic which, for the reasons enumerated above, is less than fully effective for packages that are subjected to high current densities. Furthermore, in these processes the molding tool is typically controlled to a temperature in the range of 100° C. to 175° C., while the metal surfaces of the leads are considerably lower in temperature. The temperature difference inhibits the curing of the molten resin and further lessens the strength of the bond. An additional source of leakage arises from the fact that the typical resins used as molding compounds have adhesive properties themselves and therefore require release agents to prevent their adhesion to the molding tools. A typical release agent is a microcrystalline wax, which is incorporated into the molding compound formulation. The release agent unfortunately also weakens the bond between the molding compound and the metal leads.

One solution, which has not been previously used or disclosed to the knowledge of the inventors herein, might be to simply coat the entire lead frame with adhesive compound prior to molding the package body over the leads so that the adhesive would form a chemical bond between the leads and the molding compound when the latter is cured. A difficulty with this solution is the critical nature of the electrical connections that must be made between the leads and the die. Any contamination of the surfaces of the leads at the bonding location will interfere with the wire bonding process by which a reliable electrical connection is created. This can only be prevented by an expensive and difficult cleaning process after the molding operation has been completed. This problem is aggravated in leads that are plated with electrically conductive material such as silver or gold to enhance the electrical contact with the die.

SUMMARY OF THE INVENTION

The problems enumerated above are addressed in accordance with the present invention by applying a heat-curable adhesive selectively to areas on the surface of the leads that will contact the package walls, then molding the package around the leads. The adhesive is thus cured either by the molding process itself or during post-cure of the package body. The adhesive is a material that once cured will form a seal at the interfaces between the leads and the package body that will be substantially impermeable to gases. Selection of an optimal adhesive or combination of adhesives will reflect the magnitude of the difference if any between the coefficient of thermal expansion of the lead metal and that of the package body. The adhesive may include a thermoplastic component as needed to provide resilience to the seal in the event of differences in the degree of thermal expansion. Localizing the application of the adhesive to those areas on the metal that will form the interface preserves the ability to form strong electrical contacts between the leads and the die circuitry.

These and other objects, features and advantages of the invention will be more apparent from the description that follows.

DETAILED DESCRIPTION OF THE INVENTION AND PREFERRED EMBODIMENTS

As indicated above, the optimal selection of an adhesive or adhesive composition will depend on the materials used for the electric leads and the package body. A wide variety of materials can be used for each, many such materials being disclosed in published literature on electronic materials and known in the industry for their utility.

Examples of metals that can be used for the leads (and their symbols as indicated by the *Electronic Materials Handbook*, Vol. 1, Minges, M. L., et al, eds., ASM International, Materials Park, Ohio, 1989) are:

copper
copper-iron alloys: C19400, C19500, C19700, C19210
copper-chromium alloys: CCZ, EFTEC647 copper-nickel-silicon alloys: C7025, KLF 125, C19010
copper-tin alloys: C50715, C50710
copper-zirconium alloys: C15100
copper-magnesium alloys: C15500
iron-nickel alloys: ASTM F30 (Alloy 42)
iron-nickel-cobalt alloys: ASTM F15 (Kovar)
mild steel
aluminum Preferred among these are copper, copper-containing alloys in which copper constitutes at least 95% by weight, iron-nickel alloys in which iron constitutes from about 50% to about 75% by weight, and iron-nickel-cobalt alloys in which iron constitutes from about 50% to about 75% by weight. The iron-nickel alloy Alloy 42 (58% Fe, 42% Ni) and the iron-nickel-colbalt alloy Kovar (54% Fe, 29% Ni, 17% Co), as well as the various copper alloys are of particular interest.

The types of materials that can be used as the package body, or enclosure material, include both thermosetting and thermoplastic materials. Examples of thermoplastic materials are epoxy resins and modified epoxy resins, polyurethanes, polyimides, modified polyimides, polyesters, and silicones. Examples of thermoplastic materials are polyphenylene sulfide, liquid crystal polymer, polysulfone, and polyether ketone. Thermosetting materials are typically molded by transfer molding, while thermoplastic materials are typically molded by injection molding, although different molding methods can be used for each.

An important parameter of these materials, and one that will influence the choice of adhesive used, is the coefficient of thermal expansion ("CTE"), expressed in units of parts per million (by weight) per degrees Celsius. The CTE will vary widely with the materials used, and the range of CTEs for the leads may overlap with that of the CTEs for the package body (molded plastic enclosure) materials. In certain embodiments of the invention, however, these ranges will not overlap. For example, the lead frames (including the leads) may have a CTE ranging from about 5 ppm/° C. to about 15 ppm/° C. while the package body material when cured may have a CTE ranging from about 16 ppm/° C. to about 50 ppm/° C. Alternatively, the CTE of the lead frame material and that of the package body may differ by at least about 10 ppm/° C., or by a maximum value of about 100 ppm/° C., or by a value ranging from about 20 ppm/° C. to about 50 ppm/° C. With these types of differences in the values of the CTEs, the adhesive composition preferably contains a thermoplastic component, either as the sole adhesive ingredient or as a mixture with a thermosetting adhesive ingredient.

Examples of particular resins suitable for use as adhesives, either alone or in combination, are as follows.

Thermosetting resins:
D.E.R. 332: an epoxy resin with bisphenol A (Dow Chemical Company, Midland, Mich., USA)
ARALDITE® ECN 1273: an epoxy cresol novolac (Ciba-Geigy Corporation, Ardsley, N.Y., USA)
ARALDITE® MY 721: a polyfunctional liquid epoxy resin (Ciba-Geigy Corporation)
QUARTEX® 1410: an epoxy resin with bisphenol A (Dow Chemical Company)
EPONO® 828, 1001F, 58005: modified bisphenol A epoxy resins (Shell Chemical Company, Houston, Tex., USA)
Thermoplastic resins:
Phenoxy PKHJ: a phenoxy resin (Phenoxy Associates)
Polysulfones The adhesive composition optionally includes one or more ingredients to provide the composition with any of a variety of desirable properties. Examples are curing agents, antifoaming agents, moisture getters (dessicants), and fillers to add bulk. Examples of curing agents are polyamines, polyamides, polyphenols, polymeric thiols, polycarboxylic acids, anhydrides, dicyandiamide, cyanoguanidine, imidazoles, and Lewis acids such as complexes of boron trifluoride with amines or ethers. Examples of antifoaming agents are hydrophobic silicas such as silicone resins and silanes, fluorocarbons such as polytetrafluoroethylene, fatty acid amides such as ethylene diamine stearamide, sulfonamides, hydrocarbon waxes, and solid fatty acids and esters. Examples of moisture getters are activated alumina and activated carbon. Specific products that serve as moisture getters are those identified by the supplier (Alpha Metals of Jersey City, N.J., USA) as GA2000-2, SD1000, and SD800. Examples of fillers are alumina, titanium dioxide, carbon black, calcium carbonate, kaolin clay, mica, silicas, talc, and wood flour.

The molding processes by which the package is formed is well known and widely used, and therefore will not be discussed in detail in this specification. In general, however, molding is performed over a lead frame assembly that includes a series of metal leads joined by connecting webs and arranged in discrete groups, one group for each package, adjacent groups being connected by further connecting webs that will eventually be removed when molding is complete. The assembly also contains dams at certain locations along the leads to serve as mechanical stops for the molding compound to help confine the molding compound, these dams to be removed as well before the molded packages are separated. Conventional molding techniques such as injection molding, transfer molding, insert molding, and reaction-injection molding are employed, depending on the materials used.

The adhesive is applied to the lead frame at specific locations that correspond to the locations where the molded plastic of the package enclosure will contact the leads. The adhesive may be applied to one side of the frame or to both sides, depending on the particular needs of the system. The method of application will be localized to the desired area to substantially avoid the placement of adhesive on regions that will not be embedded in the walls of the package. This type of localized application can be achieved with conventional printing or stamping processes, or preferably by inverted stamping in accordance with the procedure and apparatus disclosed in U.S. Pat. No. 5,816,158, "Inverted Stamping Process", inventor Richard J. Ross, issued Oct. 6, 1998, the contents of which are incorporated herein by reference.

The following examples are offered strictly for purposes of illustration.

EXAMPLES

The following are examples of adhesive formulations representing thermosetting formulations, thermoplastic formulations, and various combinations of the two.

| Component | Parts by Weight |
| --- | --- |
| 1. Epoxy Thermosetting Adhesive | |
| EPON 828 | 25 |
| EPON 1001F | 50 |
| Dicy CG1400 (cyanoguanidine) | 5 |

-continued

| Component | Parts by Weight |
|---|---|
| Talc | 5 |
| Titanium Dioxide | 5 |
| Cab-O-Sil ® M5 (fumed silica) | 10 |
| 2. Phenoxy Thermoplastic Adhesive | |
| Phenoxy PKHJ | 95 |
| Talc | 3 |
| Cab-O-Sil ® M5 | 2 |
| 3. Polysulfone Thermoplastic Adhesive | |
| Polysulfone (molecular weight = 20,000) | 95 |
| Titanium Dioxide | 5 |
| 4. Composite Epoxy/Phenoxy Adhesive (combination thermosetting and thermoplastic): | |
| EPON 828 | 45 |
| Phenoxy PKHJ | 45 |
| Dicy CG1400 | 3 |
| Talc | 5 |
| Carbon Black | 2 |
| 5. Composite Epoxy/Polysulfone Adhesive (combination thermosetting and thermoplastic): | |
| D.E.R. 332 | 30 |
| Polysulfone (molecular weight = 20,000) | 60 |
| Dicy CG1400 | 2 |
| Talc | 4 |
| Cab-O-Sil ® M5 | 4 |

The foregoing is offered primarily for purposes of illustration. It will be readily apparent to those skilled in the art that the materials, procedures, conditions and other parameters of the method described herein may be further modified or substituted in various ways without departing from the spirit and scope of the invention.

What is claimed is:

1. In a method for forming a hollow molded plastic enclosure with side walls of thermoplastic material penetrated by electrically conductive metallic leads to access a die to be sealed in said enclosure by molding said side walls around said leads, the improvement comprising:

(a) applying a heat-curable adhesive selectively to areas on the surface of said leads that will contact said side walls when molded, (b) molding said side walls by injection molding around said leads with said heat-curable adhesive thereon, and (c) curing said heat-curable adhesive either during or subsequent to molding said side walls, said heat-curable adhesive selected such that when cured it will seal said side walls around said leads in a manner substantially impermeable to gases.

2. A method in accordance with claim 1 in which said heat-curable adhesive is a member selected from the group consisting of thermosetting resins, thermoplastic resins, and mixtures of thermosetting and thermoplastic resins.

3. A method in accordance with claim 1 in which said heat-curable adhesive comprises a thermoplastic resin.

4. A method in accordance with claim 3 in which said thermoplastic resin is a member selected from the group consisting of phenoxy resins and polysulfones.

5. A method in accordance with claim 1 in which said heat-curable adhesive is a mixture of a thermosetting resin and a thermoplastic resin.

6. A method in accordance with claim 5 in which said heat-curable adhesive is a mixture of an epoxy resin and a thermoplastic resin.

7. A method in accordance with claim 1 in which said metallic leads are formed of a member selected from the group consisting of copper, copper-iron alloys, copper-chromium alloys, copper-nickel-silicon alloys, copper-tin alloys, copper-zirconium alloys, copper-magnesium-phosphorus alloys, iron-nickel alloys, iron-nickel-colbalt alloys, mild steel, and aluminum.

8. A method in accordance with claim 1 in which said metallic leads are formed of a member selected from the group consisting of copper, copper-containing alloys in which copper constitutes at least 95% by weight, iron-nickel alloys in which iron constitutes from about 50% to about 75% by weight, and iron-nickel-cobalt alloys in which iron constitutes from about 50% to about 75% by weight.

9. A method in accordance with claim 1 in which said thermoplastic material is a member selected from the group consisting of polyphenylene sulfide, liquid crystal polymer, polysulfone, and poly ether ketone.

10. A method in accordance with claim 1 in which said leads have a coefficient of thermal expansion of from about 5 ppm/° C. to about 15 ppm/° C., and said molded plastic enclosure material when cured has a coefficient of thermal expansion of from about 16 ppm/° C. to about 50 ppm/° C., and said heat-curable adhesive comprises a thermoplastic resin.

11. A method in accordance with claim 1 in which said leads and said molded plastic enclosure material when cured have coefficients of thermal expansion that differ from each other by at least about 10 ppm/° C.

12. A method in accordance with claim 1 in which said leads and said molded plastic enclosure material when cured have coefficients of thermal expansion that differ from each other by from about 10 ppm/° C. to about 100 ppm/° C.

13. A method in accordance with claim 1 in which said leads and said molded plastic enclosure material when cured have coefficients of thermal expansion that differ from each other by from about 16 ppm/° C. to about 50 ppm/° C.

14. A method in accordance with claim 1 in which said leads are plated with an electrically conductive material.

15. A method in accordance with claim 14 in which said electrically conductive material is a member selected from the group consisting of silver and gold.

16. A method in accordance with claim 1 in which said heat-curable adhesive comprises a resin with a desiccant dispersed therein.

* * * * *